(12) United States Patent
Tsukagoshi et al.

(10) Patent No.: US 9,773,926 B2
(45) Date of Patent: Sep. 26, 2017

(54) OPTICAL SENSOR DEVICE

(71) Applicant: SII SEMICONDUCTOR CORPORATION, Chiba-shi, Chiba (JP)

(72) Inventors: Koji Tsukagoshi, Chiba (JP); Noriyoshi Higashi, Osaka (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/117,050

(22) PCT Filed: Jan. 27, 2015

(86) PCT No.: PCT/JP2015/052100
§ 371 (c)(1),
(2) Date: Aug. 5, 2016

(87) PCT Pub. No.: WO2015/125564
PCT Pub. Date: Aug. 27, 2015

(65) Prior Publication Data
US 2016/0351730 A1 Dec. 1, 2016

(30) Foreign Application Priority Data

Feb. 18, 2014 (JP) .................................. 2014-028570
Dec. 25, 2014 (JP) .................................. 2014-262223

(51) Int. Cl.
*H01L 31/0232* (2014.01)
*H01L 31/0203* (2014.01)
(Continued)

(52) U.S. Cl.
CPC ............ *H01L 31/0203* (2013.01); *C03C 3/21* (2013.01); *H01L 31/02005* (2013.01);
(Continued)

(58) Field of Classification Search
CPC ........... H01L 31/0203; H01L 31/02005; H01L 31/02164; H01L 31/02322;
(Continued)

(56) References Cited

U.S. PATENT DOCUMENTS

2013/0000355 A1    1/2013   Oku .................................. 65/31
2015/0076645 A1*   3/2015   Fujita .................. H01L 31/0203
                                                              257/433

FOREIGN PATENT DOCUMENTS

JP     62251616     11/1987
JP     62279680     12/1987
(Continued)

OTHER PUBLICATIONS

International Search Report mailed Apr. 7, 2015 in International Application No. PCT/JP2015/052100 together with English-language translation thereof.

*Primary Examiner* — Tu-Tu Ho
(74) *Attorney, Agent, or Firm* — Adams & Wilks

(57) ABSTRACT

An optical sensor device includes a resin sealing portion for sealing an optical sensor element fixed to an element-mounting portion. The resin sealing portion is constituted of a resin having mixed and dispersed therein a glass filler obtained by pulverizing a phosphate-based glass which has spectral luminous efficacy properties by composition adjustment and high heat resistance and weatherability. The optical sensor device is highly reliable and capable of accommodating size and thickness reductions in packages and has stable and hardly changeable spectral luminous efficacy properties.

15 Claims, 7 Drawing Sheets

(51) Int. Cl.
  *C03C 3/21* (2006.01)
  *H01L 31/02* (2006.01)
  *H01L 31/0216* (2014.01)

(52) U.S. Cl.
  CPC .. *H01L 31/02164* (2013.01); *H01L 31/02322* (2013.01); *H01L 2224/32245* (2013.01); *H01L 2224/48091* (2013.01); *H01L 2224/48227* (2013.01); *H01L 2224/48247* (2013.01); *H01L 2224/48465* (2013.01); *H01L 2224/73265* (2013.01); *H01L 2924/181* (2013.01)

(58) Field of Classification Search
  CPC . H01L 2224/32245; H01L 2224/48091; H01L 2924/181; C03C 3/21
  USPC .......................................................... 257/432
  See application file for complete search history.

(56) References Cited

FOREIGN PATENT DOCUMENTS

| | | |
|---|---|---|
| JP | 2002344006 | 11/2002 |
| JP | 2006001808 | 1/2006 |
| JP | 2006213546 | 8/2006 |
| JP | 2007036264 | 2/2007 |
| JP | 2012238812 | 12/2012 |
| JP | 2013011818 | 1/2013 |
| JP | 2013168510 | 8/2013 |
| JP | 2013191834 | 9/2013 |

\* cited by examiner

[Fig. 1]
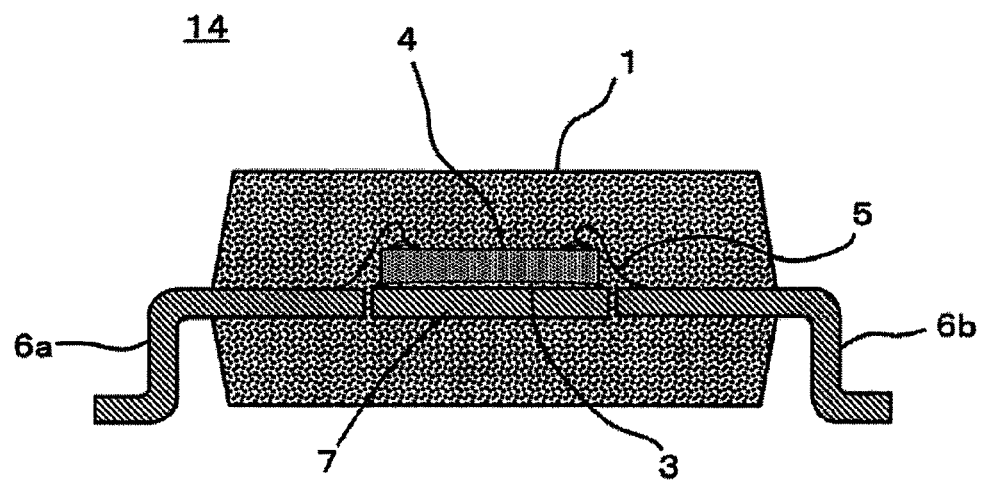
[Fig. 2]
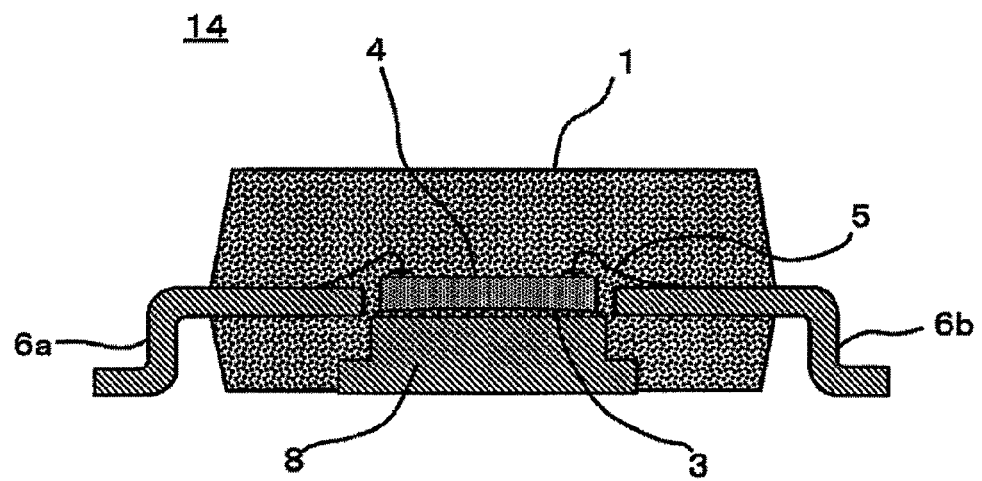

[Fig. 3]
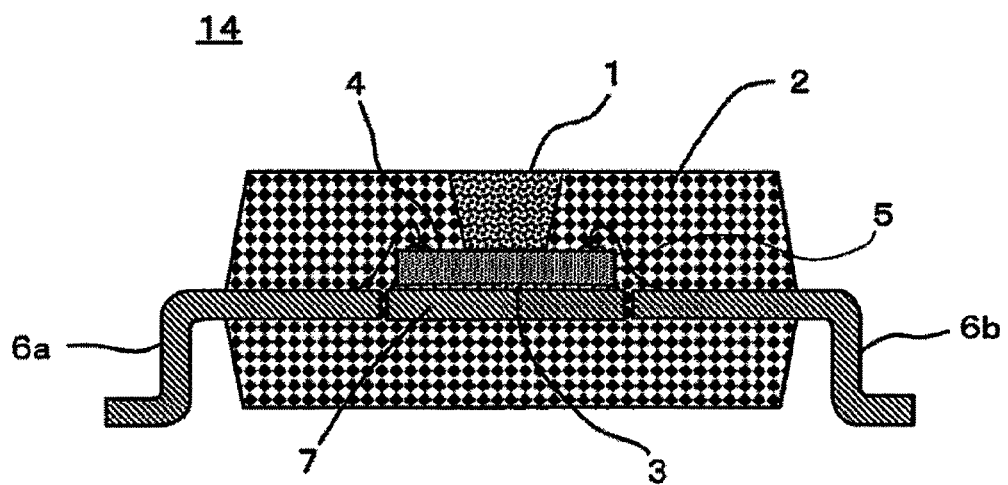
[Fig. 4]
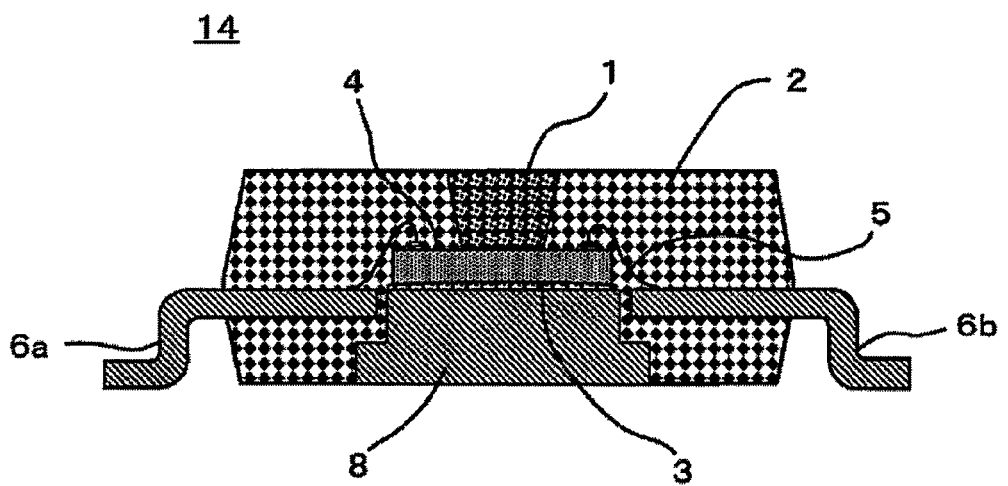

[Fig. 5]
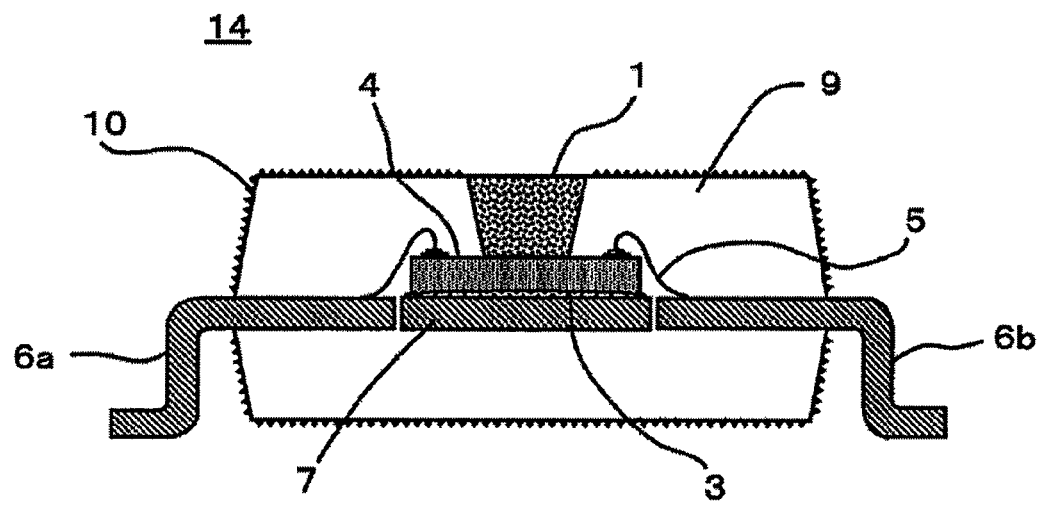
[Fig. 6]
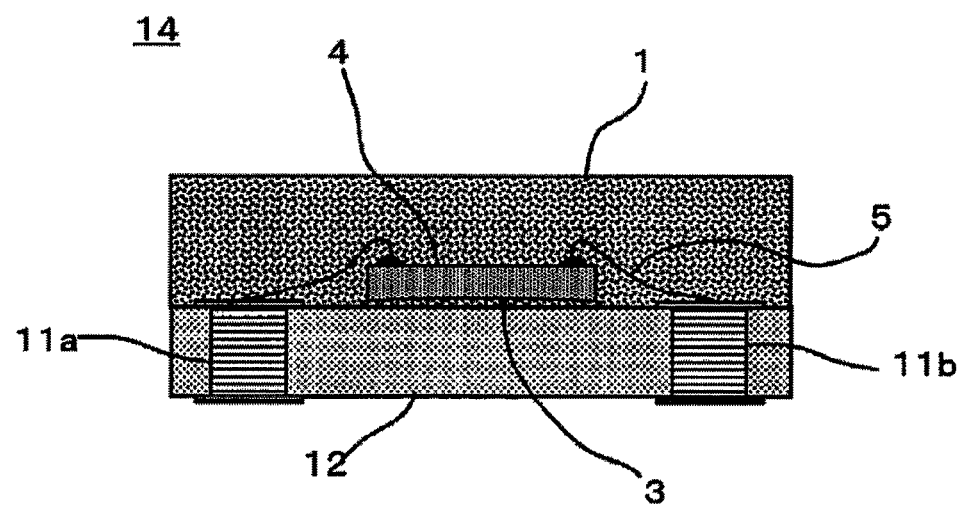

[Fig. 7]
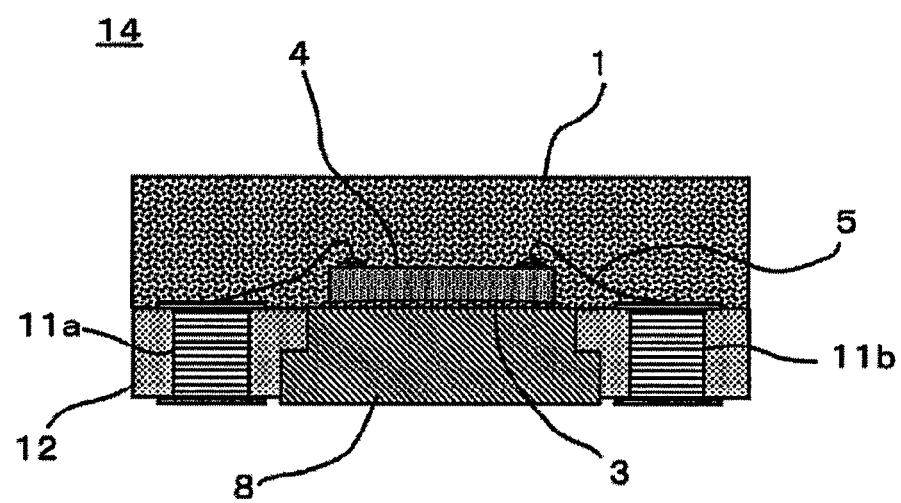
[Fig. 8]
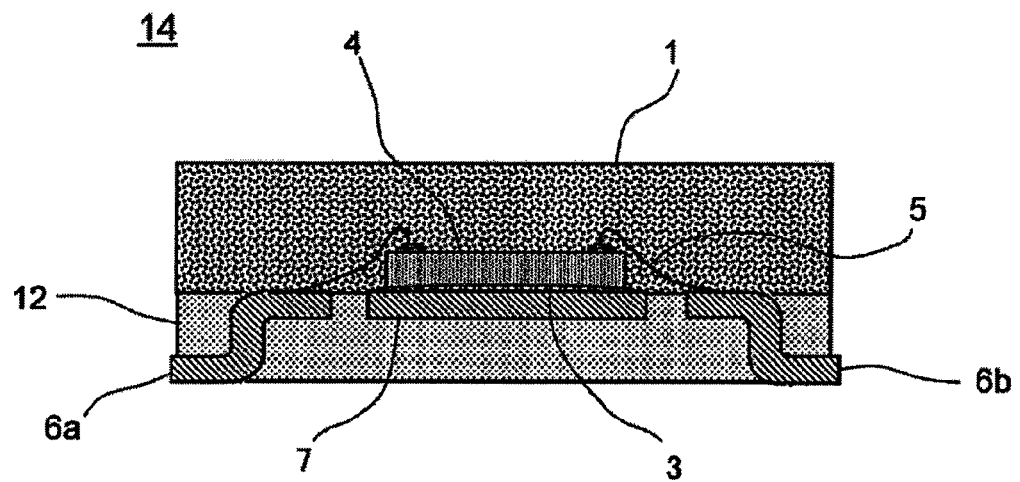

[Fig. 9]
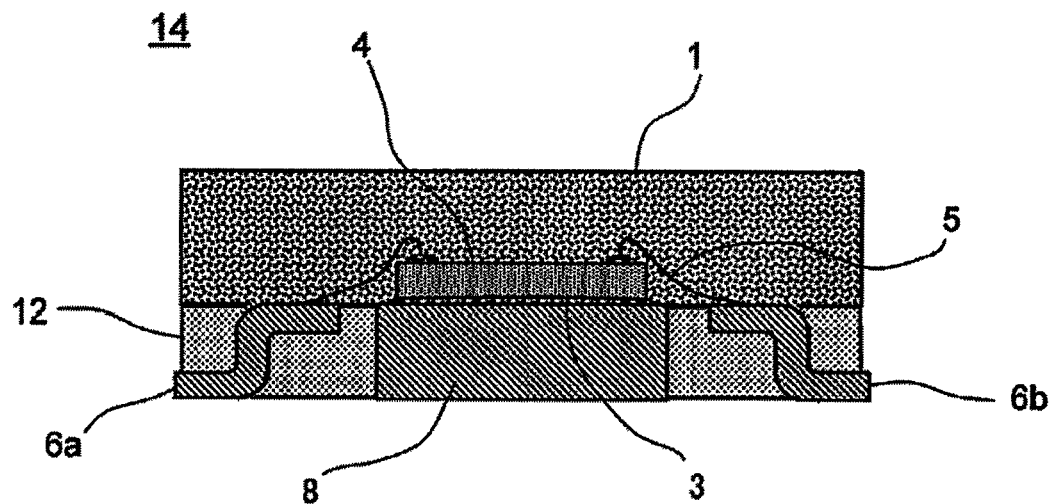
[Fig. 10]
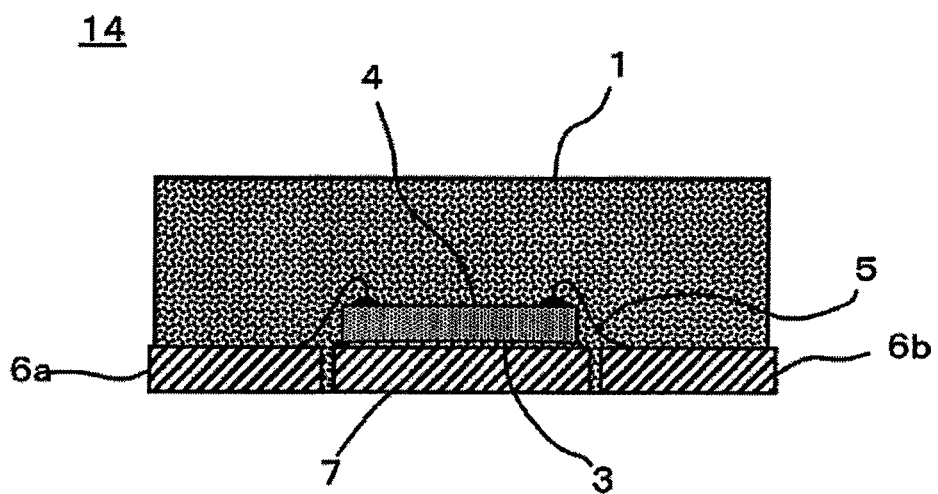

[Fig. 11]
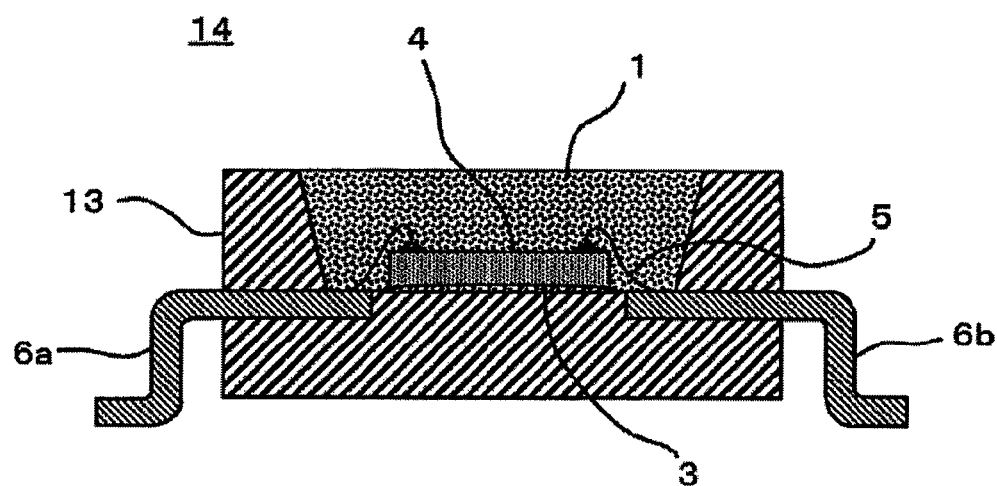
[Fig. 12]
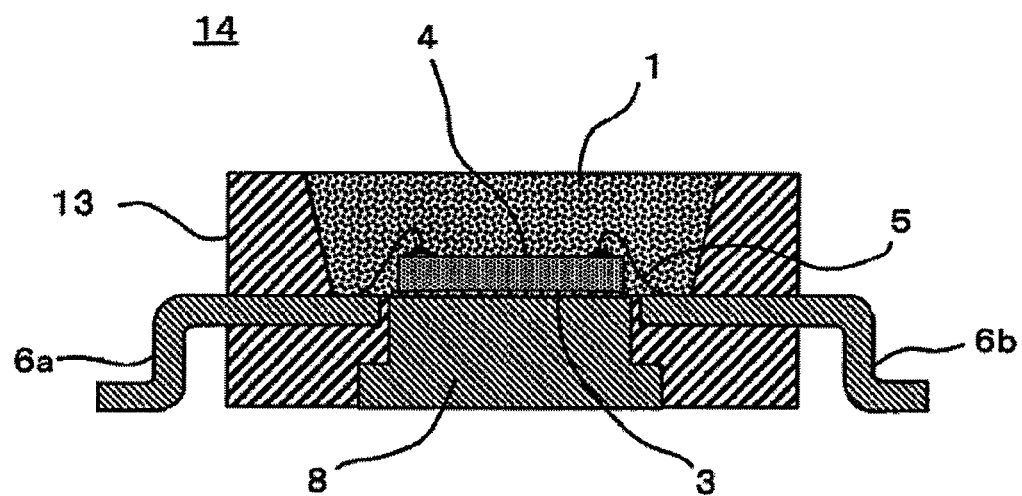

[Fig. 13]
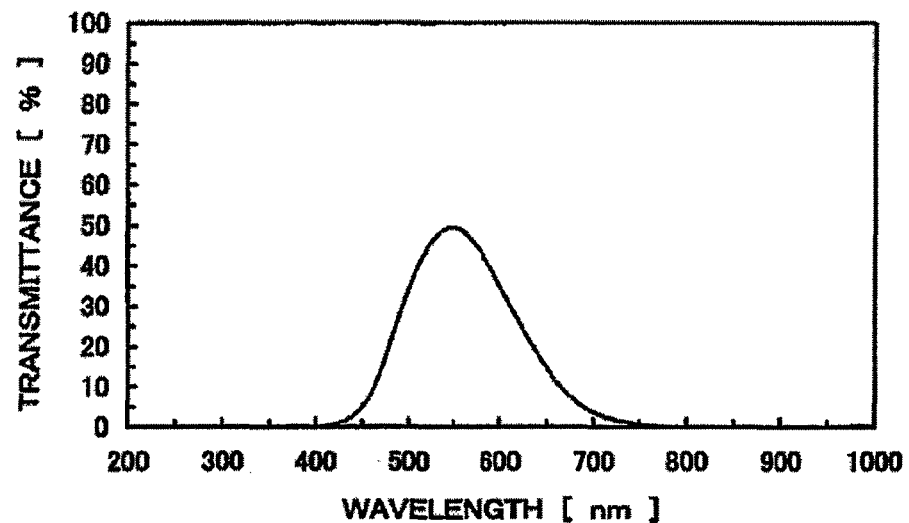
[Fig. 14]
PRIOR ART
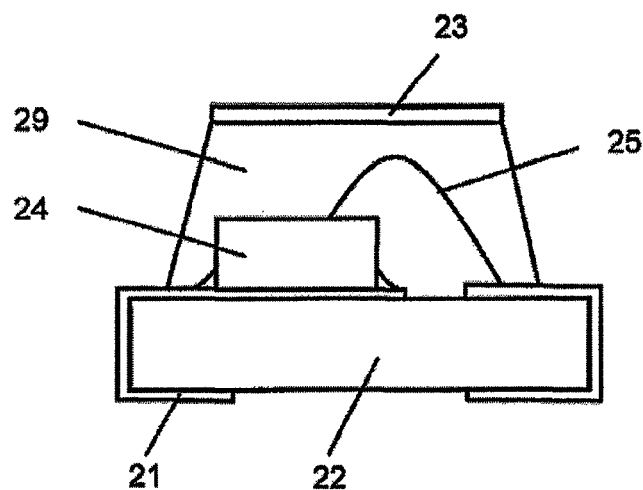

OPTICAL SENSOR DEVICE

TECHNICAL FIELD

The present invention relates to an optical sensor device using phosphate-based glass.

BACKGROUND ART

In recent living environments, convenience has been further improved by electronics, household electric appliances, in-vehicle devices, and the like which are equipped with a new function that is not found in the related art. As a background thereof, it can be said that an operation of a sensor function, which compensates the five senses of human beings, are a large portion. Increases in the number of these products have been significantly expected in a wide range of fields. Examples of a sensor include various sensors using a semiconductor, and various sensors including pressure sensors, flow rate sensors, a motion sensor, luminance sensors, distance measurement sensors, and the like have been made into products.

Among the sensors, an optical sensor including the luminance sensor has been frequently used, and has been spreading widely due to an increase in mounting on an illuminating device for an office or a house, a portable terminal, a computer, and the like for use accompanied with low power consumption. Products, on which the sensor component is mounted, have characteristics in which diversification of application, abundance of functions, and a design excellent in portability are favorable. In addition, a reduction in size, thickness, and cost, and high, reliability are required in all products without exception. Among these requirements, a requirement for a package occupies a large portion. According to this, in development of the package, application of the related ad or of new technologies has become increasingly important.

FIG. 14 is an example of a cross-sectional view of a packaged optical sensor. An optical sensor element 24 is mounted on an insulating substrate 22 on which an interconnection pattern 21 is formed through metallization, and a light-transmitting epoxy resin 29 is molded at the periphery of the optical sensor element 24 (FIG. 2 of Patent Document 1). A resin 23, which has a composition of blocking an infrared light beam, is provided in a layer shape to overlap a flat surface of an outer surface of the light-transmitting epoxy resin 29 in an immediate upward direction of the optical sensor element 24.

As the optical sensor element 24 that is mounted, a light reception sensor element is used. The interconnection pattern 21, which is obtained through metallization, is electrically connected to an electrode provided on an upper surface of the optical sensor element 24 through a wire 25, and is used as a connection terminal with an outer side. An electromotive force, which is generated by a light beam that is incident to the optical sensor element, is transmitted to an external connection terminal through the wire 25. Light beams, which are incident from an outer side in an immediate upward direction of the optical sensor element, are transmitted through the light-transmitting epoxy resin after an infrared light beam is blocked by the resin 23, and thus the optical sensor element is sensitive to light beams close to the spectral luminous efficacy properties of human beings.

However, in the package structure described in Patent Document 1, the entirety of the package structure is molded with a transparent light-transmitting resin. In addition, the resin, which has a composition of blocking the infrared light beam, is provided only at a part of the outer surface of the light-transmitting resin, which molds the periphery of the optical sensor element, in an immediate upward direction of the optical sensor element. Therefore, with respect to light beams which are incident from an oblique direction, or light beams which are incident from a lateral direction, it is difficult to block the infrared light beam. Accordingly, it is difficult for the optical sensor element to receive only light beams having characteristics on which the spectral luminous efficacy properties are reflected. According to this, it is difficult to obtain sufficient spectral luminous efficacy properties with respect to light beams which are incident from the lateral direction or the oblique direction. As a result, it is difficult to obtain the desired light reception characteristics.

The package in the related art has a structure in which the periphery of the optical sensor element is molded only with the light-transmitting epoxy resin. It is known that the light-transmitting epoxy resin is weak to heat, moisture, and ultraviolet rays. When decomposition deterioration occurs in the resin due to heat, discoloration of the resin also occurs along with the decomposition deterioration. The discoloration causes light absorption, and a decrease in the transmittance is caused to occur. Therefore, light beams, which are incident from an outer side, are attenuated. As a result, an intensity of the light received by the optical sensor element decreases, and this decrease leads to deterioration in the light reception sensitivity. In addition, when being continuously exposed to heat, the resin becomes brittle and peeling-off or cracking is likely to occur. According to this, a decrease in strength occurs, and light beams incident from an outer side are attenuated. As a result, the intensity of the light received by the optical sensor element decreases and light reception sensitivity also deteriorates.

In comparison to an epoxy resin which is typically used in sealing of an IC package and contains a large amount of silica filler, in the light-transmitting epoxy resin, filler such as silica, carbon, and alumina is not contained. Accordingly, the coefficient of expansion of the light-transmitting epoxy resin is not changed from an original value of the resin. Therefore, the coefficient of expansion is higher in comparison to a resin that contains the filler. In addition, in a thermal shock environment in which a high temperature and a low temperature are repeated, and a reflow atmosphere in which a resin is rapidly exposed to a high-temperature atmosphere, significant expansion and contraction occur in a mold resin, and these lead to peeling-off of the resin and occurrence of cracking. According to this, light beams, which are incident from an outer side, are attenuated, the intensity of the light received by the optical sensor element decreases, and partial breakage occurs in the mold resin. As a result, it is difficult to obtain high reliability.

In addition, in the resin that is provided on an outer surface of the light-transmitting mold resin to block an infrared light beam, there is a concern of deterioration in resin characteristics being also likely to occur due to heat or moisture. Particularly, in a case of a resin provided with a specific property of blocking the infrared light beam in accordance with characteristics of a portion, which is classified into a dye, in a composition and a structure of the resin, it is typically pointed out that characteristics tend to be unstable due to deterioration in a dye component with respect to an external factor such as heat and moisture. When both of the light-transmitting resin that molds the periphery of the optical sensor element, and the resin that blocks an infrared light beam deteriorate, a plurality of resin factors, which have an effect on the reliability, exist. As a result, it is difficult to obtain high reliability.

In addition, the epoxy resin contains a benzene ring in a resin structure. When the epoxy resin is continuously exposed to ultraviolet rays, the benzene ring is damaged and open-ring decomposition occurs. This represents resin decomposition, and the epoxy resin is decomposed by ultraviolet rays. As a result, it is difficult to obtain high reliability when considering that light beams, which are incident from an outer side, are attenuated, and this attenuation leads to a decrease in the intensity of the light received by the optical sensor element, and decomposition of the mold resin also occurs.

In addition, when miniaturization and thinning of the package are performed, the thickness of the mold resin further decreases. According to this, the peeling-off of the resin, the cracking, the discoloration, and the like are further likely to occur, and a decrease in mechanical strength or easiness of deformation also occurs. As a result, the reliability of the package is further likely to deteriorate.

In consideration of this situation, a method of attaining an improvement in reliability has been attempted even in the light-transmitting epoxy resin. Examples of the method include a method in which a sealing resin is filled with filler to improve strength and heat-resistant properties of the resin, and to decease the coefficient of expansion of the resin, and a method in which the resin is filled with a substance having an ultraviolet-ray absorbing effect or a light stabilizer to make a countermeasure for ultraviolet rays. When the resin is filled with the filler, there are an effect of improving strength against impact from an outer side of the resin and an effect of decreasing the coefficient of expansion. Accordingly, it is possible to attain an improvement in reliability of a product. In addition, when the substance having the ultraviolet-ray absorbing effect is introduced, in a case where the resin is exposed to ultraviolet rays, damage is mitigated, thereby obtaining an operation of retarding deterioration of the resin. In addition, a variation in spectral luminous efficacy properties or deterioration in the light reception sensitivity of the optical sensor element due to a resin factor such as decomposition, peeling-off, and cracking of the resin is mitigated. Accordingly, it is possible to realize a package that is stable in characteristics and has high reliability.

PRIOR ART DOCUMENT

Patent Document

[Patent Document 1] Japanese Unexamined Patent Application, First Publication No. 2007-36264

DISCLOSURE OF THE INVENTION

Problems to be Solved by the Invention

Accordingly, an object of the invention is to newly manufacture glass comprising a composition having high reliability and spectral luminous efficacy properties, and to provide a highly reliable optical sensor device capable of being miniaturized as a package by using a sealing resin in which filler obtained by pulverizing the obtained new glass is mixed and dispersed.

Solution to Problem

According to an aspect of the invention, an optical sensor device has a structure in which a glass filler-containing resin obtained by mixing phosphate-based glass, which is provided with spectral luminous efficacy properties through composition adjustment and is pulverized into a filler state, in a resin is used as a sealing resin of a resin-sealed package structure.

According to this, it is possible to realize a package in which the periphery of the optical sensor element is sealed by the resin mixed with the glass filler having specific spectral luminous efficacy properties. Accordingly, it is possible to obtain sufficient spectral luminous efficacy properties with respect to incidence of external light beams not only from an upper surface but also an oblique direction, or incidence of external light beams from a lateral surface direction. In addition, in comparison to a configuration in which the spectral luminous efficacy properties are obtained by only a resin represented by a dye, in a configuration in which the spectral luminous efficacy properties are obtained by the glass filler, the package can have the spectral luminous efficacy properties in combination with high heat-resistant properties. In addition, it is possible to lower the coefficient of expansion of the sealing resin, and it is possible to mitigate expansion and contraction of a mold resin due to a thermal shock environment in which a high temperature and a low temperature are repeated, and a reflow atmosphere in which a resin is exposed to a high-temperature atmosphere. As a result, peeling-off of the resin or occurrence of cracking is less likely to occur. In addition, since filler composed of glass, which is tolerant to ultraviolet rays, is used, ultraviolet deterioration of the resin is less likely to occur in comparison to a case where the spectral luminous efficacy properties are provided by the resin dye that is weak to ultraviolet rays. Accordingly, the ultraviolet deterioration of the resin may not occur. As a result, according to the optical sensor device, in the resin-sealed structure having the spectral luminous efficacy properties, it is possible to mitigate discoloration or peeling-off of the resin, and occurrence of cracking, and it is possible to reduce a variation in the spectral luminous efficacy properties and a decrease in light reception sensitivity.

In addition, as the phosphate-based glass having the spectral luminous efficacy properties, phosphate-based glass having transmittance characteristics, in which a central peak of the transmittance is in a wavelength range of 540 nm to 560 nm, the transmittance in a wavelength range of 700 nm to 1200 nm is 2% or less, and the transmittance in a wavelength range of 300 nm to 430 nm is 3% or less, may be used.

In addition, as the sealing resin, resins having light-transmitting properties such as an epoxy resin, a silicon resin, an acrylic resin, a urethane resin, a melamine resin, a urea resin, a phenol resin, a mixture thereof, polyamide, polycarbonate, and polystyrene may be used.

Effects of Invention

According to the optical sensor device of the invention, in a structure in which the periphery of the optical sensor element is sealed with a resin, the following structure is used. That is, the periphery of the optical sensor element is sealed with a resin in which glass filler obtained by pulverizing phosphate-based glass having spectral luminous efficacy properties is mixed. Accordingly, it is possible to realize a package having a resin-sealed structure that is tolerant to heat, moisture, and ultraviolet rays and is capable of continuously obtaining more stable spectral luminous efficacy properties in comparison to a resin material provided with the spectral luminous efficacy properties by using an organic material-based dye. The package has a resin-sealed structure in which fine particles obtained by pulverizing the phosphate-based glass provided with the spectral luminous efficacy properties through composition adjustment are mixed in a resin. In addition, the periphery of the optical sensor element is sealed with the resin in which the glass filler having the spectral luminous efficacy properties is mixed. The phosphate-based glass filler having the spectral luminous efficacy properties is composed of glass having transmittance characteristics in which the central peak of the transmittance is in a wavelength range of 540 nm to 560 nm, the transmittance in a wavelength range of 700 nm to 1200 nm is 2% or less, and the transmittance in a wavelength range of 300 nm to 430 nm is 3% or less. In addition, the phosphate-based glass filler is pulverized glass filler in which a particle size has a dimension of approximately 1 µm to 20 µm, and preferably 1 µm to 3 µm.

The phosphate-based glass having the spectral luminous efficacy properties has strong reliability with respect to weather resistance against a high-temperature and high-humidity environment and the like. According to this, the optical sensor device having a glass filler-mixed resin-sealed structure is capable of receiving light beams having the spectral luminous efficacy properties with respect to light beams which are incident not only from an immediate upward direction of the optical sensor element but also an oblique direction or a lateral direction, and has a glass composition having high weather resistance. As a result, it is possible to provide a highly reliable optical sensor device.

BRIEF DESCRIPTION OF DRAWINGS

FIG. 1 is a cross-sectional view schematically showing a configuration of a semiconductor device of the invention.

FIG. 2 is a front elevation view schematically showing a configuration of the semiconductor device of the invention.

FIG. 3 is a cross-sectional view schematically showing a configuration of the semiconductor device of the invention.

FIG. 4 is a cross-sectional view schematically showing a configuration of the semiconductor device of the invention.

FIG. 5 is a cross-sectional view schematically showing a configuration of the semiconductor device of the invention.

FIG. 6 is a cross-sectional view schematically showing a configuration of the semiconductor device of the invention.

FIG. 7 is across-sectional view schematically showing a configuration of the semiconductor device of the invention.

FIG. 8 is a cross-sectional view schematically showing a configuration of the semiconductor device of the invention.

FIG. 9 is a cross-sectional view schematically showing a configuration of the semiconductor device of the invention.

FIG. 10 is a cross-sectional view schematically showing a configuration of the semiconductor device of the invention.

FIG. 11 is a cross-sectional view schematically showing a configuration of the semiconductor device of the invention.

FIG. 12 is a cross-sectional view schematically showing a configuration of the semiconductor device of the invention.

FIG. 13 is a view showing the spectrum characteristics of the semiconductor device of the invention.

FIG. 14 is a cross-sectional view schematically showing a configuration of a semiconductor device of the related art.

EMBODIMENTS OF THE INVENTION

An optical sensor device of the invention has a structure in which the periphery of an element-mounting portion is sealed with a resin obtained by mixing phosphate-based glass, which has spectral luminous efficacy properties due to a specific composition and is pulverized into filler, in the resin. FIG. 1 schematically shows a cross-sectional configuration of the optical sensor device of the invention.

A resin, sealing portion is constituted by a resin in which glass filler obtained by pulverizing phosphate-based glass provided with spectral luminous efficacy properties through composition adjustment is dispersed and mixed. The periphery of optical sensor element and the element-mounting portion is constituted by a resin in which glass filler having spectral luminous efficacy properties is mixed, and the optical sensor element and the element-mounting portion come into close contact with the resin. The close contact resin is cured and constitutes a package.

A composition of the phosphate-based glass having the spectral luminous efficacy properties contains, 1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

According to the composition, the spectral luminous efficacy properties and higher weather resistance are provided in comparison to phosphate-based glass of the related art.

The phosphate-based glass having the spectral luminous efficacy properties is pulverized glass filler in which a particle size has a dimension of approximately 1 µm to 20 µm, and preferably 1 µm to 3 µm. Glass filler that is pulverized is mixed with a resin, and the resultant mixture is kneaded. The kneaded mixture is made into a paste state or a slurry state after being subjected to de-foaming and compatibilization. According to this, a liquid resin shape in which glass filler is mixed is obtained. A lead frame or a substrate on which the optical sensor element is mounted is set in a resin sealing mold, and then the mold is filled with the glass filler-containing resin that is liquid state and the glass filler-containing resin is cured to obtain a package shape.

It is possible to realize a structure in which the periphery of the optical sensor element mounted on the lead frame and the substrate, which do not have a cavity on an upper side of the element-mounting portion, is sealed with a resin. A metal or a member obtained by subjecting a resin to metallization is used as the lead frame, and a member formed from a resin, ceramic, a metal, glass, or silicon is used as the substrate. In addition, it is also possible to realize a structure in which the periphery of the optical sensor element, which is mounted on the lead frame and the substrate which have a cavity, is filled with a resin.

Hereinafter, a configuration of the optical sensor device will be described reference to Examples on the basis of the accompanying drawings.

Example 1

FIG. 1 is a longitudinal cross-sectional view schematically showing an optical sensor device 14 of this example. An optical sensor element 4 is stuck and fixed to an element-mounting portion 7 by a die attaching agent 3. In addition, an electrode (not shown) is provided on an upper surface of the optical sensor element 4, and the electrode provided on the optical sensor element 4 and lead frames 6a and 6b are electrically connected to each other through a wire 5. Here, typically, the element-mounting portion 7 is formed from the same material as that of the lead frames 6a and 6b, and is referred to as die pad. In addition, the periphery of the optical sensor element 4, the element-mounting portion 7, and a part of the lead frames 6a and 6b which are connected to the optical sensor element 4 through the wire 5 is covered with a resin sealing portion 1 obtained by dispersing and mixing phosphate-based glass, which is pulverized into filler and has spectral luminous efficacy properties, in a resin to obtain an exterior packaging structure. A part of the lead frames 6a and 6b is exposed from the resin sealing portion 1 to an outer side, and functions as an external terminal.

As an example of a manufacturing method, glass filler, which is obtained by pulverizing glass having spectral luminous efficacy properties into fine particles, is dispersed and mixed in a resin, and the resultant mixture is molded to a tablet. The periphery of the optical sensor element is sealed with the tablet by using a transfer mold method. According to this, the resin sealing portion 1 can be made as a package.

The phosphate-based glass, which is made into glass filler, has spectral luminous efficacy properties, and a composition thereof contains, in terms of % by weight, 1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

According to this composition, as shown in FIG. 13, it is possible to provide spectral luminous efficacy properties in which the central peak of the transmittance is in a wavelength range of 540 nm to 560 nm, the transmittance in a wavelength range of 700 nm to 1200 nm is 2% or less, and the transmittance in a wavelength range of 300 nm to 430 nm is 3% or less, and it is possible to provide weather resistance higher than that of phosphate-based glass in the related art.

A comparison result of this example and a comparative example, which shows the effectiveness of the composition, is shown in Table 1. Although being relative evaluation, it can be confirmed that spectral luminous efficacy properties shown in FIG. 13 and high weather resistance are compatible with each other by a composition and the addition amount in present Example A based on this example in Table 1. In a comparative experiment, it is considered that absence of BaO in Comparative Example B, and presence of $B_2O_3$ or $SiO_2$ in Comparative Example C or D have an unfavorable effect.

TABLE 1

| Composition | Addition amount (%) | | | |
| --- | --- | --- | --- | --- |
| | Present Example A | Comparative Example B | Comparative Example C | Comparative Example D |
| $P_2O_5$ | 40 to 60 | 50 to 70 | 40 to 60 | 40 to 60 |
| BaO | 20 to 40 | | | |
| $B_2O_3$ | | | | 1 to 10 |
| $SiO_2$ | | | 1 to 5 | |
| ($Al_2O_3$ + $La_2O_3$ + $Y_2O_3$) | 1 to 8 | 10 to 30 | 10 to 30 | |
| (ZnO + MgO + CaO + SrO) | 1 to 15 | 1 to 15 | 1 to 10 | |
| ($Li_2O$ + $Na_2O$ + $K_2O$) | 1 to 15 | 1 to 15 | 10 to 30 | 10 to 30 |
| CuO | 3 to 10 | 3 to 10 | 3 to 10 | 3 to 10 |
| $V_2O_5$ | 1 to 5 | 1 to 5 | 1 to 5 | 1 to 5 |
| NiO | 1 to 5 | 1 to 5 | 1 to 5 | 1 to 5 |
| Spectral luminous efficacy properties | ○ (good) | ○ (good) | X (poor) | Δ (mediocre) |
| weather resistance | ○ (good) | X (poor) | ○ (good) | X (poor) |

According to the sealing structure using a resin obtained by dispersing and mixing filler glass, which is obtained from phosphate-based glass, in a resin, it is possible to obtain spectral luminous efficacy properties in which the transmittance in a short-wavelength region of 300 nm to 430 nm is 3% or less, and the transmittance in a long-wavelength range of 700 nm to 1200 nm is 2% or less, and the transmittance in a wavelength range of 540 nm to 560 nm is 50% or greater in a resin-sealed structure. In addition to this, it is possible to decease the coefficient of expansion of a resin by 30% or greater, and it is possible to obtain spectral luminous efficacy properties due to glass in which the transmittance in the wavelength range of 540 nm to 560 nm is greater than a transmittance in a configuration of using a resin dye or glass of the related art, and which is tolerant to spectral luminous efficacy heat or ultraviolet rays. As a result, it is possible to obtain a package having a resin-sealed structure with high reliability.

The resin having the spectral luminous efficacy properties may be obtained by mixing filler glass obtained by pulverizing phosphate-based glass having wavelength characteristics in which the transmittance in a wavelength range of 700 nm to 1200 nm is 2% or less, and filler glass obtained by pulverizing phosphate-based glass having wavelength characteristics in which the transmittance in a wavelength range of 300 nm to 430 nm is 3% or less in a resin in a constant ratio.

Example 2

FIG. 2 is across-sectional view of an optical sensor device 14 of this example. In the resin sealing portion 1, a portion having a package structure obtained by performing sealing with a mixture, in which glass filler obtained by pulverizing glass having spectral luminous efficacy properties into fine particles is dispersed and mixed in a resin, by the transfer mold method is similar to Example in FIG. 1. However, the resin sealing portion 1 has a structure in which an element-mounting portion 8 having heat dissipation properties is made thick in a cross-sectional direction, and a part of the element-mounting portion 8 is exposed from the resin sealing portion 1. According to this, the element-mounting portion 8 having the heat dissipation properties can dissipate heat generated in the optical sensor element 4 to an outer side of the resin sealing portion 1. As a result, it is possible to realize a package with low heat resistance.

Example 3

FIG. 3 is a cross-sectional view of an optical sensor device 14 of this example. A resin sealing portion 2 performs sealing by using a material, in which glass filler obtained by pulverizing glass having light-shielding properties into fine particles is dispersed in a resin, according to the transfer mold method. In a state in which the resin sealing portion 2 is cured, an opened site is provided in an upper surface direction of the optical sensor element 4, and the opened site is filled with a liquid resin obtained by dispersing and mixing glass filler having spectral luminous efficacy properties in a resin. Then, the liquid resin is cured. According to this, the optical sensor device 14 has a structure in which the resin sealing portion 1 having the spectral luminous efficacy properties is provided. According to this, a package may have a structure in which the spectral luminous efficacy properties can be obtained only in an immediate upward direction of the optical sensor element 4. As a result, it is possible to realize a package having a structure effective for a use in which the way to use, in which the spectral luminous efficacy properties from an oblique direction or a lateral direction are not necessary, is required for the optical sensor element 4.

Here, the resin sealing portion 2 has a package structure in which sealing is performed with a mixture obtained by dispersing and mixing glass filler, which is obtained by pulverizing glass having light-shielding properties into fine particles, in a resin. Phosphate-based glass made into glass filler has light-shielding properties, and is intended to have the light-shielding properties in which the transmittance in a wavelength range of 300 nm to 1200 nm is 2% or less. A composition of the phosphate-based glass contains, in terms of % by weight, 1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 1% to 5% of CoO,
7) 3% to 10% of CuO,
8) 5% to 15% of $V_2O_5$, and
9) 1% to 5% of NiO.

According to, this composition, it is possible to provide weather resistance higher than that of phosphate-based glass of the related art. In addition, it is possible to realize a package having a resin-sealed structure in which physical properties including the coefficient of expansion of the phosphate-based glass having light-shielding properties become close to those of the phosphate-based glass having the spectral luminous efficacy properties, a difference in the coefficient of expansion the resin sealing portion 1 and the resin sealing portion 2 does not matter, and the resin sealing portion 1 and the resin sealing portion 2 have the same high weather resistance level.

Example 4

FIG. 4 is a cross-sectional view of an optical sensor device 14 of this example. The resin sealing portion 2 has a package structure obtained by performing sealing with a mixture, in which glass filler obtained by pulverizing glass having light-shielding properties into fine particles is dispersed and mixed in a resin, by the transfer mold method. The resin sealing portion 1 that is used to fill the opening is composed of a liquid resin in which glass filler obtained by pulverizing glass having spectral luminous efficacy properties into fine particles is dispersed and mixed in a resin, and has the same structure as in the example in FIG. 3 except for a structure in which an element-mounting portion 8, which has heat dissipation properties and is formed from the same material as that of the lead frames 6a and 6b, is made to be thick in a cross-sectional direction, and a part thereof is exposed from the resin sealing portion 1. According to this, the element-mounting portion 8 having the heat dissipation properties can dissipate heat generated in the optical sensor element 4 to an outer side of the resin sealing portion 1. As a result, it is possible to realize, a package with low heat resistance.

Example 5

FIG. 5 is a cross-sectional view of an optical sensor device 14 of this example. In a resin sealing portion 9, a light-transmitting resin is used for sealing in accordance with the transfer mold method. A shape after curing the resin sealing portion 9 is set to a structure in which an opened site having dimensions smaller than that of the optical sensor element is provided in an upper surface direction of the optical sensor element 4, and the opened site is filled with a liquid resin obtained by dispersing and mixing glass filler having spectral luminous efficacy properties in a resin. Then, the liquid resin is cured. According to this, the resin sealing portion 1 having spectral luminous efficacy properties is provided. Here, an outer peripheral surface of the resin sealing portion 9 has a wrinkle shape, and is set to a rough surface on which rough processing, marks remain to have an optical scattering effect. According to this, a surface structure, in which light beams from an outer side are reflected from or scattered on the surface, and are greatly attenuated, is obtained. According to this, even when using the light-transmitting resin in which glass filler having light-shielding properties is not dispersed and mixed in a resin, it is possible to realize a package having a structure that is capable of obtaining a constant scattering and reflection effect with respect to light beams from an outer side, and is capable of having spectral luminous efficacy properties in an immediate upward direction of the optical sensor element 4.

In addition, instead of a configuration in which light beams are reflected from or scattered on the outer peripheral surface of the resin sealing portion, it is also possible to employ a configuration in which light beams are reflected or scattered on an inner side of the resin sealing portion. For example, the periphery of the element is sealed with a resin in which particles such as silica, alumina, and frosted glass which have refractive indexes different from each other are dispersed and mixed in a resin in a constant amount. According to this, light reception sensitivity having spectral luminous efficacy properties is obtained from light beams incident from an upper surface direction of the optical sensor element, and light beams incident from the periphery other than the upper surface direction of the element are scattered and attenuated, and do not reach an element surface.

Example 6

FIG. 6 is a cross-sectional view of an optical sensor device 14 of this example. As the resin sealing portion 1, a resin, which is obtained by dispersing and mixing glass filler having, spectral luminous efficacy properties in a resin, is used. The resin seals only an upper surface of a mounting substrate 12 on which the optical sensor element is provided through a transfer mold method or potting. In a case of potting, a paste-shaped or slurry-shaped resin is used. As the mounting substrate 12 on which the optical sensor element is mounted, a substrate from a resin, ceramic, glass, or silicon is used. In addition, through-electrodes 11a and 11b, which serve as external terminals, are provided to the mounting substrate 12 on which the optical sensor element is mounted. The through-electrodes 11a and 11b have a structure of passing through a surface on which the optical sensor element 4 is mounted, and an opposite surface. An electrode (not shown), which is provided on an upper surface of the optical sensor element 4, is connected to the through-electrodes 11a and 11b on a surface side on which the optical sensor element 4 is mounted through the wire 5 for electrical connection. The through-electrodes 11a and 11b function as external terminal due to a through-structure. According to this, the external terminals do not have dimensions equal to or water than a width of the resin sealing portion 1. Accordingly, it is possible to realize a compact package. In addition, since the mounting substrate 12, on which the optical sensor element is mounted, is formed from a resin, ceramic, glass, silicon, a metal, and the like, it is easy to make the mounting substrate 12 thin. As a result, it is possible to realize a small-sized thin package.

Example 7

FIG. 7 is a cross-sectional view of an optical sensor device 14 of this example. A mounting substrate 12 on which the optical sensor element is provided, and a package structure, which is obtained by performing filling scaling with a resin in which glass filler having spectral luminous efficacy properties is dispersed and mixed through potting, relating to the resin sealing portion 1 are similar to those of the example in FIG. 6. However, the mounting substrate 12, on which the optical sensor element is mounted, is provided with an element-mounting portion 8 that has heat dissipation properties, passes through a surface of the mounting substrate 12 on which the optical sensor element 4 is mounted and an opposite surface of the mounting substrate 12, and has a thickness with which a part or one surface as a bottom surface is exposed to an outer side, and the optical sensor element 4 is stuck to the element-mounting portion 8. The element-mounting portion 8 having heat dissipation properties is formed from the same material as that of the through-electrodes 11a and 11b, or an additional metallic material. According to this, the element-mounting portion 8 having the heat dissipation properties can dissipate heat generated in the optical sensor element 4 to an outer side. As a result, it is possible to realize a low-heat-resistance package structure capable of being miniaturized and thinned.

Example 8

FIG. 8 is a cross-sectional view of an optical sensor device 14 of this example. The resin sealing portion 1 has a package structure in which sealing is performed by using a mixture in which glass filler obtained by pulverizing glass having spectral luminous efficacy properties into fine particles is dispersed and mixed in a resin in accordance with the transfer mold method, or the sealing is performed by using a liquid resin through potting filling. This structure is the same as in the example in FIG. 6. This example is different from the example in FIG. 6 in that lead frames 6a and 6b, which function as external terminals, are bent on an inner side of the element mounting substrate 12 on which the optical sensor element 4 is mounted to be accommodate in a width of the element mounting substrate 12, and have a through-electrode structure with anon-lead design in which front end portions and rear surface portions of the lead frames are exposed from a surface of the element mounting substrate 12.

According to this, in the optical sensor device 14, it is possible to reduce a mounting area, and it is easy to reduce a size. In addition, the mounting substrate 12 is formed from a resin, ceramic, and the like. Accordingly, it is possible to realize a package having high strength and durability with respect to a substrate portion to which a stress such as thermal history and a load, or impact in accordance with mounting is directly transferred. In addition, in the mounting substrate 12, the element-mounting portion 7 may be omitted. In this case, the optical sensor element 4 is mounted on a surface of the mounting substrate formed from a resin, ceramic, and the like.

Example 9

FIG. 9 is a cross-sectional view of an optical sensor device 14 of this example. The resin sealing portion 1 has a package structure in which sealing is performed by using a mixture in which glass filler obtained by pulverizing glass having spectral luminous efficacy properties into fine particles is dispersed and mixed in a resin in accordance with the transfer mold method, or the sealing is performed by using a liquid resin through potting filling. In addition, the element mounting substrate 12 on which the optical sensor element 4 is mounted has a structure in which the lead frames 6a and 6b are accommodated in a substrate width. These configurations are the same as in the example in FIG. 8. The optical sensor device 14 of this example is different the example in FIG. 8 in that the optical sensor element 4 has a structure in which the element-mounting portion 8 having heat dissipation properties is provided. The element-mounting portion 8 having heat dissipation properties is formed from the same metal as in the lead frames 6a and 6b, or a material having high thermal conductivity. According to this, in the optical sensor device 14, a mounting area is small, and it is easy to reduce a size. In addition, it is possible to allow the mounting substrate to have high strength and durability. Furthermore, it is possible to realize a low-heat-resistance package structure capable of dissipating heat generated in the optical sensor element 4.

Example 10

FIG. 10 is a cross-sectional view of an optical sensor device 14 of this example. The resin sealing portion 1 has a package structure in which sealing is performed by using a mixture in which glass filler obtained by pulverizing glass having spectral luminous efficacy properties into fine particles is dispersed and mixed in a resin in accordance with the transfer mold method, or the sealing is performed by using a liquid resin through potting filling. This configuration is the same as in the example in FIG. 6. However, the optical sensor device 14 of this example has the following different structure. An element-mounting portion 7 and external terminals 6a and 6b are formed from a metal or a member obtained by providing a metal to a resin or ceramic through metallization. The element-mounting portion 7 is not made to be thick in a cross-sectional direction, and is set to have the same thickness as that of the external terminals 6a and 6b. In addition, a side opposite to a surface, on which the optical sensor element 4 is mounted, is exposed to an outer side. According to this, even in a structure using a metallic lead frame without using a substrate, or even when using the member that is formed by providing a metal on a resin or ceramic through metallization, it is possible to realize low-heat-resistance package structure in which external dimensions can be made to be thin and small, and which is capable of dissipating heat generated in the optical sensor element 4 to an outer side.

Example 11

FIG. 11 is a cross-sectional view of an optical sensor device 14 of this example. A package is constituted by a mounting portion 13 having a cavity, lead frames 6a and 6b, and the optical sensor elements 4. The optical sensor element 4 is stuck and fixed to a bottomed surface, which becomes the bottom of the cavity in the mounting portion 13 having the cavity, by a die attaching agent 3. A part of the lead frames 6a and 6b is exposed to the bottomed surface that is the bottom of the cavity, and is connected to an electrode (not shown) that is provided on an upper surface of the optical sensor element 4 through a wire 5 to obtain electrical connection. One side of the lead frames 6a and 6b passes through the mounting portion having the cavity and is exposed to an outer side, and functions as an external terminal. The cavity is filled with a resin in which glass filler having spectral luminous efficacy properties is dispersed and mixed through potting to form the resin sealing portion 1 that seals the cavity. As the glass filler that is dispersed and mixed in the resin, and has the spectral luminous efficacy properties, the phosphate-based glass having the composition shown in Example 1 may be used. The mounting portion 13 having the cavity has a structure formed from a resin, ceramic, and the like which have light-shielding properties or reflectivity, and heat-resistant properties. The resin having reflectivity can be obtained by the same method described in Example 5. According to this, it is possible to realize a package that has heat-resistant properties or weather resistance, and is strong against impact from an outer side.

Example 12

FIG. 12 is a cross-sectional view of an optical sensor device 14 of this example. A package structure, which includes the mounting portion 13 having a cavity, the lead frames 6a and 6b, and the resin sealing portion 1 in which the cavity is filled and sealed with a resin in which glass filler having spectral luminous efficacy properties is dispersed and mixed through potting, is the same as in the example in FIG. 11. However, the optical sensor device 14 has the following different structure. The element-mounting portion 8, which is formed from the same material as that of the lead frames 6a and 6b and has heat dissipation properties, is made to be thick in a cross-sectional direction, and a part thereof is exposed from a rear surface of the mounting portion 13 having the cavity. According to this, the element-mounting portion 8 having the heat dissipation properties can dissipate heat generated in the optical sensor element 4 to an outer side. Accordingly, it is possible to realize a package that has heat-resistant properties or weather resistance, is strong against impact from an outer side, and has low heat resistance.

INDUSTRIAL APPLICABILITY

With regard to an optical sensor device using a package having a structure in which the periphery of the optical sensor element is sealed with a resin, when using a structure in which the sealing is performed with a resin in which glass filler obtained by pulverizing newly developed phosphate-based glass having spectral luminous efficacy properties due to a specific composition is dispersed and mixed, the spectral luminous efficacy properties of light beams, which are received by the light reception optical sensor element, can have directivity of a wide angle including not only an immediate upward direction of the optical sensor element but also an oblique direction or a lateral direction, and it is possible to greatly improve angle dependency.

The phosphate-based glass having the spectral luminous efficacy properties according to the invention has transmittance characteristics in which the transmittance of light beams of a wavelength in an ultraviolet region and the transmittance of light beams of a wavelength in an infrared region is 3% to 2%, and has a composition having high heat-resistant properties and high weather resistance due to glass. Accordingly, in comparison to a configuration in which the spectral luminous efficacy properties are provided with a resin, an absorption rate of the ultraviolet wavelength and the infrared wavelength is higher and more satisfactory spectral luminous efficacy properties is obtained for a long period of time. In addition, the phosphate-based glass has high reliability that is less susceptible to heat, ultraviolet rays, and moisture. According to this, it is possible to provide an optical sensor device having characteristics which are less susceptible to the ambient environment and in which a variation with the passage of time is small. As a result, the phosphate-based glass can contribute to supply of the optical sensor device to a television, a household electric appliance, and a portable terminal, and further an optical sensor device mounted apparatus with concern of an in-vehicle use or an outdoor use in more severe environments.

REFERENCE SIGNS LIST

1: Resin sealing portion in which phosphate-based glass filer having spectral minions efficacy properties is included in resin
2: Resin sealing portion in which phosphate-based glass filler having light-shielding properties is included in resin
3: Die attaching agent
4: Optical sensor element
5: Wire
6a, 6b: Lead frame
7: Element-mounting portion
8: Element-mounting portion having heat dissipation property
9: Light-transmitting resin
10: Optical scattering and diffusing wrinkle processed surface
11a, 11b: Through-electrode
12: Optical sensor element mounting substrate
13: Mounting portion having cavity
14: Optical sensor device

The invention claimed is:
1. An optical sensor device, comprising:
an element-mounting portion;
an optical sensor element fixed to the element-mounting portion;
a lead frame in which one end is connected to the optical sensor element through a wire, and another end functions as an external terminal; and
a resin sealing portion covering the element-mounting portion, the optical sensor element, and the lead frame,
the resin sealing portion being entirely constituted by a resin in which glass filler obtained by pulverizing phosphate-based glass having specific spectral luminous efficacy properties is dispersed and mixed, and a composition of the phosphate-based glass having the specific spectral luminous efficacy properties containing, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

2. The optical sensor device according to claim 1, wherein the resin sealing portion has characteristics in which a central peak of a transmittance is in a wavelength range of 540 nm to 560 nm, a transmittance in a wavelength range of 700 nm to 1200 nm is 2% or less, and a transmittance in a wavelength range of 300 nm to 430 nm is 3% or less.

3. The optical sensor device according to any claim 1, wherein a particle size of the glass filler is 1 μm to 20 μm.

4. The optical sensor device according to claim 1, wherein a part of the element-mounting portion is exposed from the resin sealing portion.

5. The optical sensor device according to claim 1, wherein the optical sensor device has a structure in which a periphery of the optical sensor element is sealed by a transfer mold method by using a tablet obtained by molding the resin in which filler obtained by pulverizing the phosphate-based glass having the specific spectral luminous efficacy properties is mixed.

6. An optical sensor device, comprising:
an element-mounting portion;
an optical sensor element fixed to the element-mounting portion;
a lead frame in which one end is connected to the optical sensor element through a wire, and another end functions as an external terminal; and
a resin sealing portion covering the element-mounting portion, the optical sensor element, and the lead frame,
the resin sealing portion consisting of a first resin sealing portion that is constituted by a resin in which glass filler obtained by pulverizing phosphate-based glass having specific spectral luminous efficacy properties is dispersed and mixed, and a second resin sealing portion that is constituted by a resin in which glass filler obtained by pulverizing phosphate-based glass having specific light-shielding properties is dispersed and mixed.

7. The optical sensor device according to claim 6, wherein a composition of the phosphate-based glass having the specific spectral luminous efficacy properties contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO; and
wherein a composition of the phosphate-based glass having the specific light-shielding properties contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 1% to 5% of CoO,
7) 3% to 10% of CuO,
8) 5% to 15% of $V_2O_5$, and
9) 1% to 5% of NiO.

8. The optical sensor device according to claim 6, wherein the first resin sealing portion has characteristics in which a central peak of a transmittance is in a wavelength range of 540 nm to 560 nm is in, a transmittance in a wavelength range of 700 nm to 1200 nm is 2% or less, and a transmittance in a wavelength range of 300 nm to 430 nm is 3% or less, and
wherein the second resin sealing portion has characteristics in which a transmittance in a wavelength range of 300 nm to 1200 nm is 2% or less.

9. An optical sensor device, comprising:
an optical sensor element;
a mounting substrate on which the optical sensor element is provided;
a through-electrode provided to pass through the mounting substrate, and in which a first end is connected to the optical sensor element and multi-ends become an external connection terminal; and
a resin sealing portion covering upper surfaces of the mounting substrate and the optical sensor element,
the resin sealing portion being entirely constituted by a resin in which glass filler obtained by pulverizing phosphate-based glass having specific spectral luminous efficacy properties is dispersed and mixed.

10. The optical sensor device according to claim 9, wherein a composition of the phosphate-based glass having the specific spectral luminous efficacy properties contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

11. The optical sensor device according to claim 9, wherein the resin sealing portion has characteristics in which a central peak of a transmittance is in a wavelength range of 540 nm to 560 nm, a transmittance in a wavelength range of 700 nm to 1200 nm is 2% or less, and a transmittance in a wavelength range of 300 nm to 430 nm is 3% or less.

12. The optical sensor device according to claim 9, wherein the mounting substrate is provided with an element-mounting portion of which a part is exposed to an outer side in a through manner from a surface on which the optical sensor element is mounted to an opposite surface.

13. The optical sensor device according to claim 9, wherein the through-electrode is a lead frame that is bent at the inside of the mounting substrate, and is accommodated within the width of the mounting substrate, and
a front end portion and a rear surface portion of the lead frame are exposed from a surface of the mounting substrate.

14. An optical sensor device, comprising:

a mounting portion having a cavity;

an optical sensor element fixed to a bottomed surface of the mounting portion;

a lead frame in which one end is exposed to the bottomed surface and is connected to the optical sensor element through a wire, and another end is exposed from the mounting portion and functions as an external terminal; and a resin sealing portion with which the cavity is filled, the resin sealing portion being entirely constituted by a resin in which glass filler obtained by pulverizing phosphate-based glass having specific spectral luminous efficacy properties is dispersed and mixed, and a composition of the phosphate-based glass having the specific spectral luminous efficacy properties containing, in terms of % by weight, 1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

15. The optical sensor device according to claim 14, wherein the mounting portion is provided with an element-mounting portion of which a part is exposed to an outer side in a through manner from the bottomed surface to which the optical sensor element is fixed to an opposite surface.

* * * * *